United States Patent [19]
Yamasaki et al.

[11] Patent Number: 4,797,887
[45] Date of Patent: Jan. 10, 1989

[54] SEQUENTIAL DECODING METHOD AND APPARATUS

[75] Inventors: Norikazu Yamasaki, Tokyo; Keiichiro Koga, Saitama, both of Japan

[73] Assignee: Kokusai Denshin Denwa Co., Ltd., Tokyo, Japan

[21] Appl. No.: 921,517

[22] Filed: Oct. 22, 1986

[30] Foreign Application Priority Data

Nov. 1, 1985 [JP] Japan .................. 60-244105

[51] Int. Cl.$^4$ ............................................. G06F 11/10
[52] U.S. Cl. ......................................................... 371/43
[58] Field of Search .................. 371/2, 43, 44, 45; 340/347 DD

[56] References Cited

U.S. PATENT DOCUMENTS 4,539,684  9/1985  Kloker ........................ 371/45 X
4,677,625  6/1987  Betts ............................. 371/43

OTHER PUBLICATIONS

G. C. Clark et al., "Error-Correction Coding for Digital Communications", 1981, pp. 326-328.

Primary Examiner—Jerry Smith
Assistant Examiner—Robert W. Beausoliel
Attorney, Agent, or Firm—Armstrong, Nikaido, Marmelstein & Kubovcik

[57] ABSTRACT

A sequential decoding of a convolutionally encoded sequence has been proposed. Decoding is carried out by extending paths along the branches of code-tree over plural tree levels at a time and calculating likelihood (metric) of the extended paths referring to the received sequence. Decoding is terminated when it proceeds to a node belonging to the last tree level of a data block. Then, one of the extended sequences associated with a node located at the last tree level which has the largest metric is output as a decoded sequence.

8 Claims, 15 Drawing Sheets

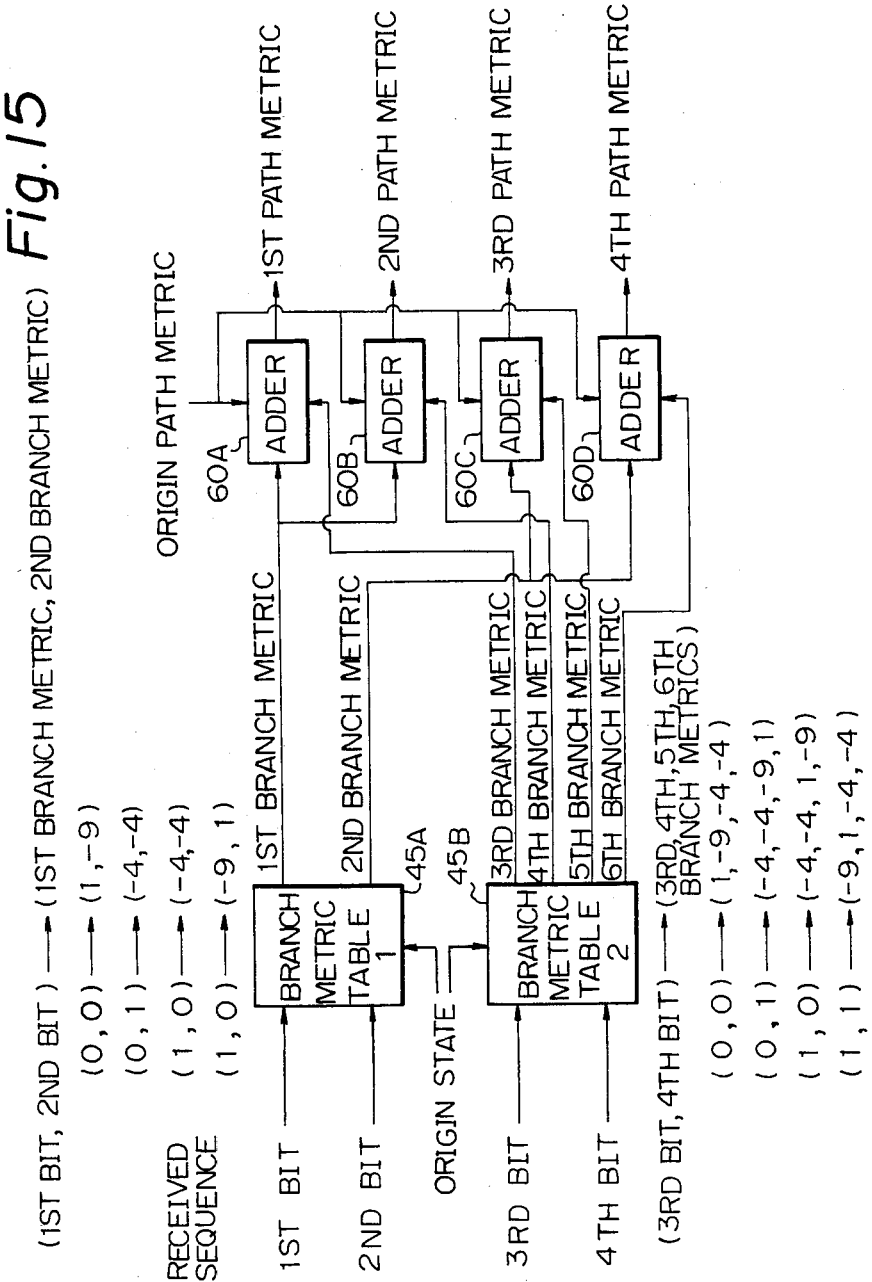

SEQUENTIAL DECODING METHOD AND APPARATUS

BACKGROUND OF THE INVENTION

The present invention relates to an error correcting scheme for random errors occurred on channels and, in particular to sequential decoding of convolutionally encoded data, or a convolutional code.

A block code and a convolutional code are well-known as forward error correcting (FEC) codes used on channels with random noise such as satellite communication channels. The decoding error rate of the convolutional code decreases exponentially as its constraint length (K) increases. Generally speaking, the error-correcting capability of convolutional code is superior to that of the block code if an apparatus for decoder of the convolutional code is equivalent to that for the block code in terms of the scale of hardware. Therefore, application of the convolutional code to digital satellite communication channels is now actively performed.

Viterbi decoding and sequential decoding are known as decoding methods of the convolutional code, and especially the speeding up of each decoding has been studied. Viterbi decoding, (which is also called maximum likelihood decoding) has a high error-correcting capability and is thus used in various kinds of fields. However, the use of Viterbi decoding is limited to the convolutional code with its constraint length (K) relatively short ($K \leq 8$) because the scale of hardware for Viterbi decoding increases exponentially with the increase in the constraint length of the code.

On the other hand, sequential decoding is a decoding method with simplifies the maximum likelihood decoding method and can thus be implemented with a relatively small scale of hardware. In view of this matter, sequential decoding can be called quasi-maximum likelihood decoding. Though the error-correcting capability of sequential decoding is somewhat inferior to that of Viterbi decoding when convolutional codes have the same constraint length, the scale of an apparatus for sequential decoding has a linear relationship to the increase in the constrain length of the code, approximately. Therefore, sequential decoding makes it possible to configure a decoder which can handle even a code having a relatively long constraint length and which has a higher capability of error-correcting than the Viterbi decoder. However, the number of calculations necessary for decoding considerably varies depending on channel quality, while it is almost independent of the constraint length of the code. This means that under a very noisy channel condition, it is difficult to operate sequential decoder at a high speed.

As is well-known, there are provided two types of decoding algorithm as conventional methods of sequential decoding; one is a Fano algorithm and the other is a stack algorithm (which is also called Zigangirov-Jelinek algorithm: abbreviated as Z-J algorithm hereinafter). The error-correcting capability of the Fano algorithm is generally equivalent to that of the latter under the same channel condition. However, hardware for the stack algorithm is somewhat complicated as compared with that for the Fano algorithm, because a relatively large scale of memory is necessary for stacking. In view of this point, most sequential decoders which have been practically utilized are based on the Fano algorithm.

Nevertheless, the stack algorithm is very attractive. This is why it is very simple as compared with the Fano algorithm. The Fano algorithm is very complicated and there is no room for improvement. In terms of the average number of calculations expended on decoding of convolutional code, (which is an important factor to validate the properties of the sequential decoder), the stack algorithm is superior to the Fano algorithm, for considerably noisy channels. In practice, the stack algorithm is generally faster than the Fano algorithm for a channel having less than 8 dB of the ratio of signal power per information bit to noise power density ($E_b/N_o$).

The description will firstly be given of convolutional coding of a sequence of information bits for the sake of understand of a conventional stack algorithm, which will be explained later.

FIG. 1 illustrates a configuration of a coder in the case that the constraint length (K) of the code is equal to 3, the number (v) of bits composed of a branch of code word, is equal to 2 and the coding rate (r) is thus equal to $\frac{1}{2}$. A sequence of information bits generated by an information source (not shown) is supplied via an input terminal 1 to a shift register 2 composed of two serially-connected one-symbol delay elements 2a and 2b. The input terminals of each of modulo-2 adders 3 and 4 are connected to the delay element 2a and 2b as shown in FIG.1. Output terminals 5 and 6 of the coder are connected to the outputs of the adders 3 and 4, respectively. As will be apparent from FIG. 1, one bit is output at each of the terminals 5 and 6 every time one information bit is supplied to the input terminal 1. In other words, one information bit is encoded into a 2-bit code word.

FIG. 2 illustrates a binary tree structure of code word sequences possibly generated by the coder of FIG. 1. In this figure, a circle indicates a node, and a numeral inserted into the circle indicates a node number associated with the node. Furthermore, a line connecting two neighbor nodes together is called a branch, and a numeral attached to a branch denotes a code word composed of two digits. Moreover, a numeral in a set of parentheses represents a state of the shift register 2.

At the start of the coding process, the coder is specified to be "located" at the root node 0 of the tree. In this case, the state of the shift register 2 is initialized to (00). If the first bit of the information sequence which is supplied to the input terminals 1 is a 0, the coder follows the upper branch out of the root node 0 to a next node 1. In this case, the coder generates a code word (00) at the output terminals 5 and 6, and the state of the shift register 2 is (00). On the contrary, if the first bit is a 1, the coder follows the lower branch out of the root node 0 to a next node 2, which is located at the same tree level as the node 1. In this case, the coder generates a code word (11) and the state of the shift register is changed from (00) to (10). In this manner, the coder follows branches in response to consecutive information bits. Therefore, a code word sequence generated in response to an information bit sequence corresponds to any one of the paths through the tree. For instance, if an information bit sequence is (0,1,1,0), the coder follows a path indicated by the thick path and generates a code word sequence (00,11,01,01). The information bit sequence is divided into several blocks for the convenience of decoding. In the above example, a block is composed of four information bits and accordingly the tree has four tree levels. Each block is followed by $(K-1)$ 0s (in the above example, two zero-bits) in order to terminate the block data and initiallize the shift register 2 for the next coming block data. The code word sequence thus generated is sent through a channel to a receive side.

A decoder using a conventional stack algorithm determines the most likely path in the tree specified by the coder. For this purpose, the decoder proceeds to reconstruct paths through the tree in response to a received bit sequence by calculating correlation index (likelihood or metric) between the received sequence and paths through the tree. Then, it puts out, as a decoded sequence, one code word sequence which has the largest correlation.

The description will be given of a detail of a conventional stack algorithm, referring to FIG. 3.

(1) Firstly, insert the root node 0 into a stack and place it at the top position of the stack (block 101 in FIG. 3).

(2) Calculate the likelihood of each of two branches likelihood to the likelihood of the node which is positioned at the top of the stack to obtain the likelihoods of the two nodes 1 and 2 (block 102).

(3) Eliminate from the stack the node positioned at its top (block 103).

(4) Insert the two nodes obtained by the above item (2) into the stack (block 104).

(5) Arrange the nodes in the stack in decreasing order of the likelihood of the node (block 105).

(6) Repeat the operations of blocks 102-105 with regard to a node which has newly been placed at the top, and then terminate the decoding operation when a node belonging to the last or deepest tree level is placed at the top (block 106).

(7) Output a path leading from the root node to the node at the top of the stack (block 107).

In the above stack algorithm, two branches are extended out of a node positioned at the top of the stack every time the operation of block 102 is carried out (the operation of extending branches is termed "extension" hereafter). Then, the likelihood of each of the two branchs (which is referred to as a branch metric hereafter) is calculated. In this case, the Hamming distance between the received sequence and each bit sequence associated with the respective branches is calculated, and the branch metric of each branch is determined in accordance with the calculated Hamming distance. The values of branch metrics are selected such that if decoding proceeds along a correct path, the likelihood of the path (which is referred to as a path metric hereafter, which corresponds to the sum of the branch metrics of branches forming the path) should be increased and, on the other hand, if decoding proceeds along an incorrect path, its path metric should be decreased. By way of example, the branch metrics 1, −4 and −9 are given corresponding to the Hamming distances 0, 1 and 2, respectively as shown in FIG. 2.

The description will now be given of calculation of path metrics and process of the decoding algorithm based on the stack algorithm, referring to an example of a tree structure of FIG. 4 where the constraint length K=3 and the coding rate r=½. Note that in this figure, a numeral under a branch denotes a branch metric and a numeral in ( ) attached to each node denotes its path metric.

Assuming that a code word sequence sent on a channel is (00,11,01,01) as shown in FIG. 2, and that a received code word sequence is changed to (01,11,00,01) because of noise on the channel.

(1) Firstly, insert the root node 0 into the stack.

(pb 2) Calculate the Hamming distance between the first received sequence (01) and each of the code words (00) and (11) on the branches diverging from the root node 0. In this case, since both the Hamming distances are equal to 1, the branch metric −4 is given to each branch. Thus, the path metrics of the nodes 1 and 2 are equally −4.

(3) Eliminate the node 0 positioned at the top of the stack and insert the new nodes 1 and 2 into the stack and arrange them in decreasing order of their path metrics. In this example, the nodes 1 and 2 have the same path metric. In this case, assuming that one node whose node number is larger than the other has priority, the node 2 is placed at the top of the stack.

(4) Beginning with the node 2, repeat extension, calculation of path metrics and arrangement in decreasing order. Those processes correspond to the blocks 102 to 105 in FIG. 3 (a sequence of blocks 102 to 105 is defined as a step). Every time a step is executed, the contents in the stack are varied as shown in Table-1 below.

TABLE 1

| Step | Node Number in the Stack (Path Metric) |
|---|---|
| 1 | 0(0) |
| 2 | 2(−4), 1(−4) |
| 3 | 1(−4), 6(−8), 5(−8) |
| 4 | 4(−3), 6(−8), 5(−8), 3(−13) |
| 5 | 10(−7), 9(−7), 6(−8), 5(−8), 3(−13) |
| 6 | 21(−6), 9(−7), 6(−8), 5(−8), 3(−13), 22(−16) |
| | (Termination of Decoding) |

(5) Terminate extension when one node belonging to the last tree level is placed at the top of the stack(node 21, in this example). Then, output the path [00-11-01-01] following out of the root node 0 to the node 21.

As shown in Table-1, the node number and path metric of each of the nodes are stored into the stack. As will be apparent from Table 1, according to the conventional stack algorithm, the number of the stored node increases by 1 every one step.

As described in the foregoing, the information bit sequence is divided into a plurality of blocks each of which has a predetermined length and is fed to the coder. The end of each block is followed by (K−1) 0s in order to reset the contents of the shift register 2 to (00) of the initial state. Correspondingly, the decoding is also decoded per block in accordance with the decoding algorithm of FIG. 3.

SUMMARY OF THE INVENTION

The present invention relates to an improvement of a prior sequential decoding based on a conventional stack algorithm as described in the foregoing.

It is an object of the present invention to reduce time necessary for decoding to thus provide a higher-speed sequential decoding method and an apparatus.

It is another object of the present invention is to improve error-correcting capability.

It is still another object of the present invention is to reduce storage capacity of a stack memory.

The above and the other objects are attained by a sequential decoding method for a received code word sequence which is convolutionally encoded. The decoding method is to determine a most likely path on the specified code tree as a decoded sequence referring to the received sequence. The present method comprises;

a first step of inserting a root node of the tree into a top of a stack memory, a second step of extending paths along a code-tree from the node placed at the top over plural tree levels at a time, a third step of calculating likelihoods of destination nodes at which the extension arrive, referring to the received sequence, a fourth step of eliminating the node placed at the top from the stack and then storing the destination nodes instead, a fifth step of reordering all the nodes stored in the stack in decreasing order of the likelihood, so that one node having the largest likelihood is placed at the top instead of the eliminated node, a sixth step of repeating a set of steps from the second step to the fifth step until a node of the last tree level is placed at the top, and a seventh step of outputting, as an error-corrected sequence, a code word sequence associated with a path leading from the root node to the node of the last level.

BRIEF DESCRIPTION OF THE DRAWINGS

Further objects, features and advantages of the present invention can be more fully understood by means of the following description and accompanying drawings wherein:

FIG. 15 is a block diagram of hardware for calculating path metrics.

DESCRIPTION OF THE PREFERRED EMBODIMENTS

As described before, according to the conventional stack algorithm, two branches are extended toward two nodes from a node which is positioned at the top of the stack, by one decoding step in the case of rate ½ codes. In other words, the decoder proceeds by one tree level, every time one step is performed. For example, destination nodes due to one extension process beginning with the node 0 are the nodes 1 and 2.

Figure 1:
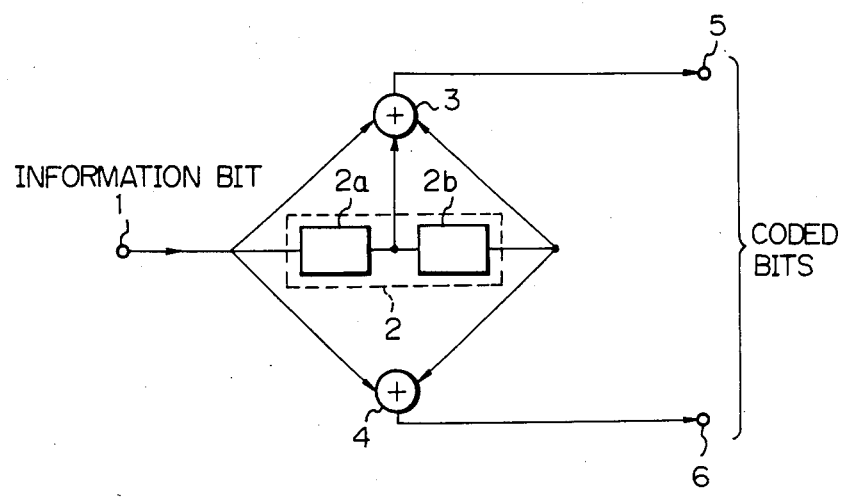
FIG. 1 is a circuit diagram of an example of a coder (K=3, r=½)
Figure 2:
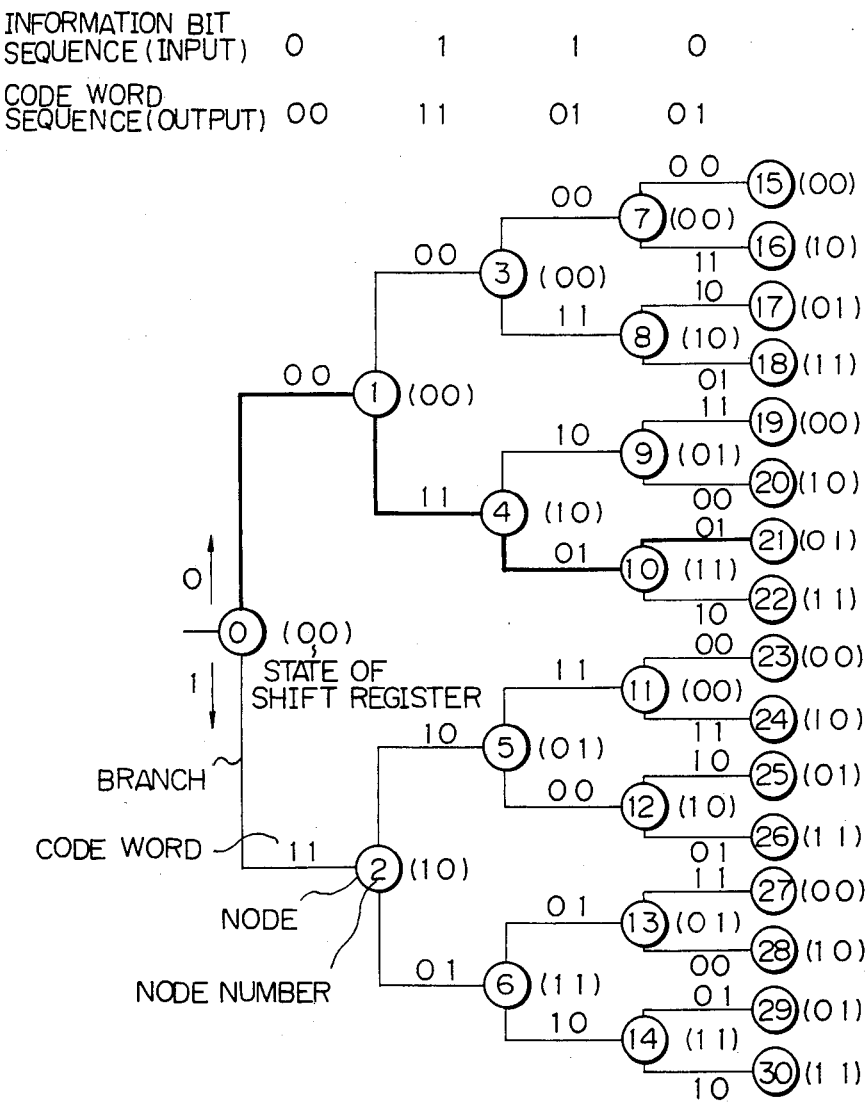
FIG. 2 shows a tree structure of a convolutional code.
Figure 3:
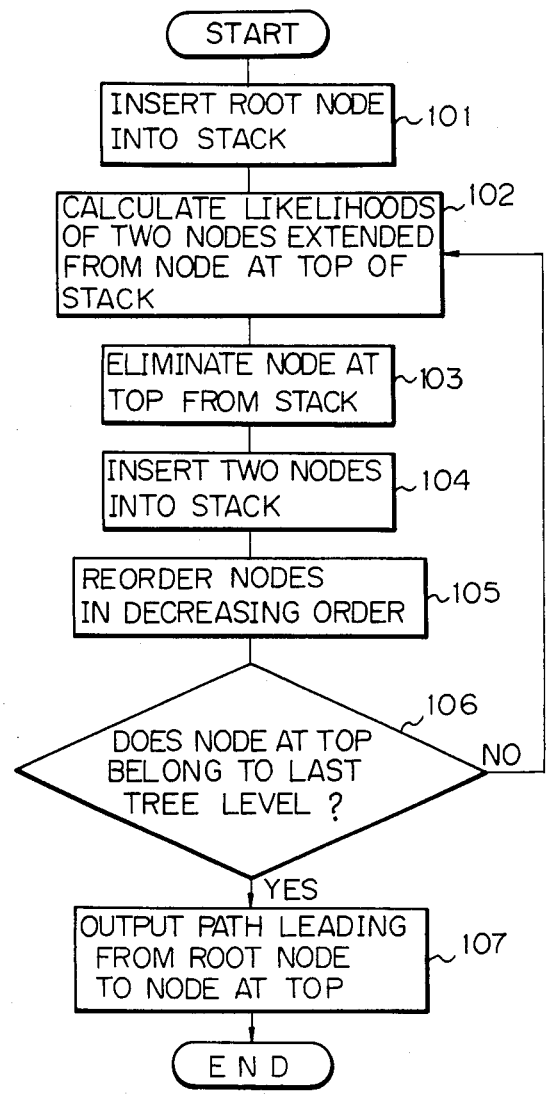
FIG. 3 is a flowchart of a conventional stack (Z-J) algorithm.
Figure 4:
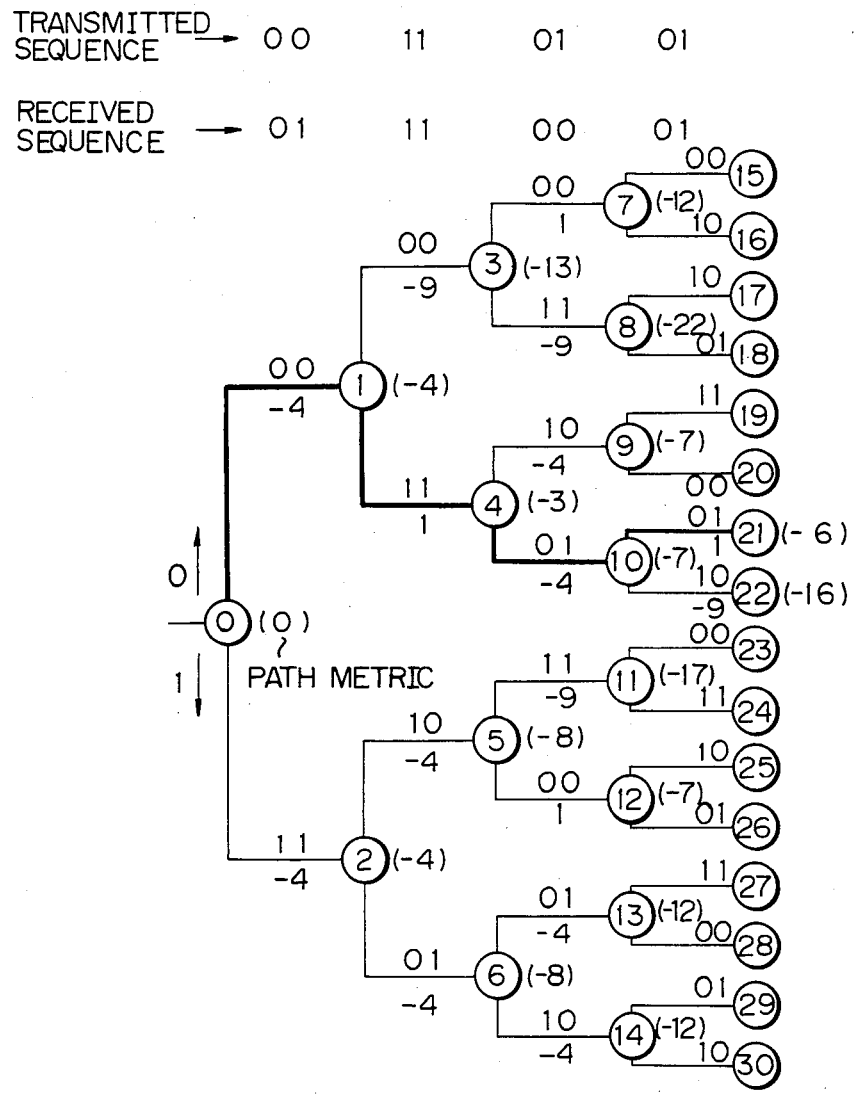
FIG. 4 is an explanation view of a conventional stack algorithm and calculation manner of path likelihoods based thereon.

The present invention is intended to improve the prior stack algorithm such that extension is performed, at one time, over plural tree levels. For example, suppose that the number (m) of tree levels to be extended is equal to 2, branches diverging from the node 0 shown in FIG. 4 are extended up to the nodes 3, 4, 5 and 6. In the explanation described below, a decoding method which is proposed by the present invention is referred to as a Multiple Level Extension (abbreviated as MLE) method.

It will be appreciated that the MLE method can provide high error-correctiong capability as compared with the conventional stack algorithm. This is because decoding based on the MLE proceeds by m-levels at one time of extension and it is thus possible to get path metrics of paths toward $2^m$ nodes. Consequently, the MLE method can provide a coding gain higher than the conventional stack algorithm (Z-J algorithm). However, in principle, the MLE method handles nodes larger than those handled by the Z-J algorithm. This leads to the increase in not only the number of calculations executed to obtain branch metrics and path metrics but also capacity of the stack memory.

Therefore, according to the present invention, the MLE method is preferably combined with at least one of a purging process, an improved metric calculation manner and an omitting process of extension. Furthermore, in order to facilitate those processes, there are provided a numbering rule and an extension rule.

The description will firstly be given of a numbering rule.

NUMBERING RULE

Figure 5:
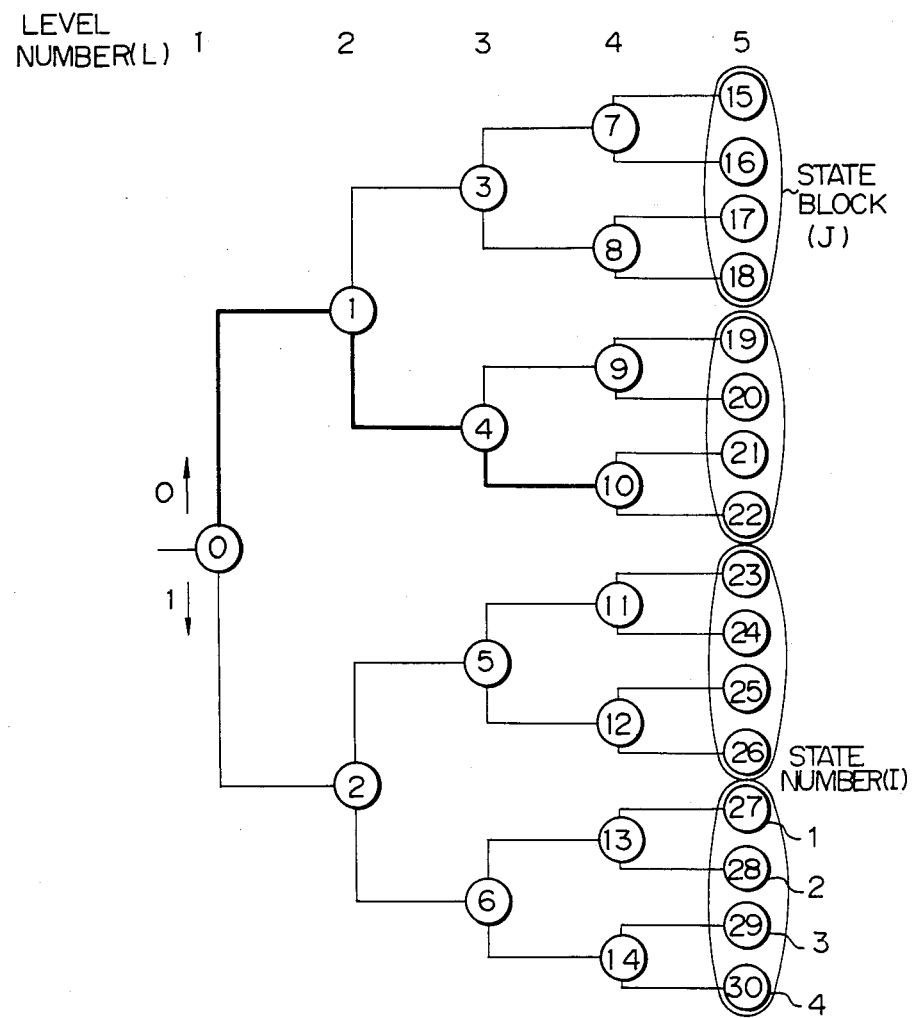
FIG. 5 is an explanation view of a numbering rule and an extension rule according to the present invention.

Assume that a tree structure of a code whose constraint length is K, the number of states $N_s=2^{K-1}$, and the coding rate r=½. In this case, the node number N can be expressed as follows:

$$N = \sum_{l=1}^{L-1} 2^{l-1} + N_s(J-1) + I - 1 \qquad (1)$$

where character L denotes the level number representing depth of the node N, character J denotes the number of state blocks determined so as to sequentially divide all the nodes which belong to the same level into groups, per the number of states, starting with a node having the smallest node number of said nodes (J: J=1, ..., $2^{L-1}/N_s$), and character I denotes the state number indicating the state of the nodes, or the state of the shift register in the same state block (I=1,2,...,$N_s$). FIG. 5 shows the numbering rule schematically.

Hence, the node number N can be rewritten by L, J and I as follows:

$$(N)=(L, J, I) \qquad (2)$$

For example, the node number 21 shown in FIG. 5 can be expressed as $$(21)=(5, 2, 3) \qquad (3)$$

The equation (3) indicates that the node 21 corresponds to a node where the level is 5, the number of the state block is 2 and the state number is 3.

EXTENSION RULE

This rule is defined by using the above numbering rule as follows. Suppose now that at a time, extension over (m) levels is carried out beginning with a node (N) and branches reach $2^m$ nodes N'(i):i=1,2,...,$2^m$, N'(i) can be expressed as $$N'(i) = 2^m N + (2^m - 1) + i - 1 \quad (i = 1, 2, \ldots, 2^m) \quad (4)$$

For example, if one extension whose extension level (m) is equal to 2 is performed starting with the node 4 shown in FIG. 5 according to the MLE method, it will be understood from the equation (4) that the decoding process proceeds up to four nodes (19), (20), (21) and (22). Assuming that in general, when one extension is carried out beginning with a node (N) (=(L, J, I)), the decoding operation proceeds up to nodes (N'(i)) (=(L'(i), J'(i), I'(i)) (i = 1, 2, ..., 2^m), those nodes can be expressed with the following equations (5) to (9):

$$N'(i) = \sum_{l=1}^{L'-1} 2^{l-1} + N_s(J'(i) - 1) + I'(i) - 1 \quad (5)$$

$$L' = L + m \quad (6)$$

$$I'(i) = (i - 1) \bmod N_s + 1 \quad \text{(in the case that } 2^m \geq N_s) \quad (7)$$

$$I'(i) = \{(I_m - 1) \bmod N_s/2^m\} 2^m + i \quad \text{(in the case that } 2^m < N_s) \quad (8)$$

$$J'(i) = 1/N_s \left\{ 2^m \cdot N - 2^m + 2 - \sum_{l=1}^{L} 2^{m(l-1)} - I'(i) \right\} + 1 \quad (9)$$

For example, if one extension over two levels is performed starting with the node 4, which is represented as (4)=(3, 1, 2) by using L, J and I, destination nodes are definitely calculated by using the equations (6)–(9) as follows:

(L', J'(i), I'(i)) (i=1,2,3,4);(5,2,1),(5,2,2),(5,2,3) and (5,2,4).

PURGING PROCESS

As described in the foregoing, the increasing rate in nodes stored in the stack based on the present MLE method is larger than that based on the Z-J algorithm. This leads to the increase in nodes to be stored in the stack and thus necessity of a memory having a large capacity. In this case, it should be noted that nodes in the stack includes ones which are not very important for precise decoding. It is therefore attempted to purge such unnecessary nodes from the stack to limit the growth of the stack size. Such a process is called "purging". According to the present invention, there are provided two types of purging processes: one is a metric purging process and the other is a state purging process.

(Metric Purging Process)

Figure 6:
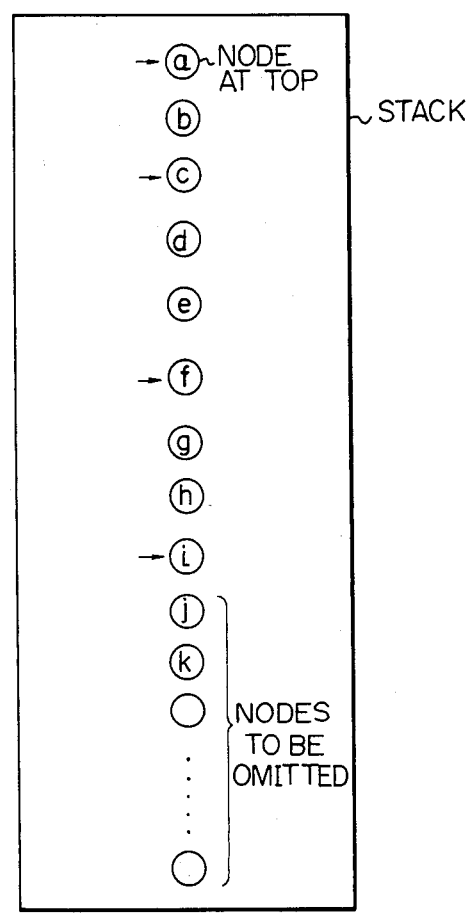
FIG. 6 is an explanation view of a metric purging process according to the present invention.

A metric purging process is defined so as to purge, from the stack, nodes whose path metrics are smaller than that of a node having the smallest path metric of $2^m$ nodes which have just been entered into the stack. This operation is not needed per step, but may periodically be carried out every 10 to 20 steps. The metric purging process permits elimination of unnecessary nodes from the stack withoout degradation of error-correcting capability. By way of example, referring to FIG. 6, it is assumed that four nodes a, c, f and i have just been entered into the stack by the MLE method whose extension level (m) is equal to 2 and also that the node i has the smallest path metric, all the nodes j, k, . . . whose path metrics are smaller than that of the node i are purged from the stack. It has been observed from our computer simulations that when such operation is periodically carried out every 10 steps, the average number of nodes contained in the stack until the decoding is completed is smaller than the half of the average number in the case of the conventional Z-J algorithm, without degradation of the decoding-error rate. Therefore, the use of the metric purging process effectively permits reduction of the stack size.

(State Purging Process)

Figure 7:
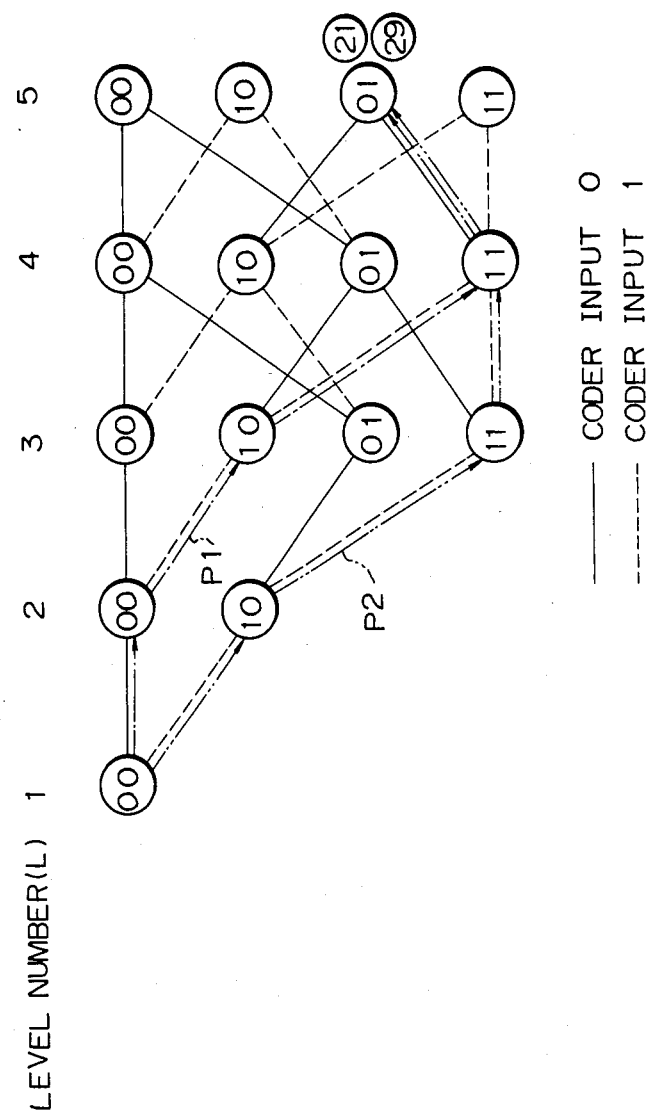
FIG. 7 is a trellis view which is a version of the tree structure of FIG. 2, FIGS. 8 and 9 are explanation views of a metric calculation manner according to the present invention.

In the tree structure of FIG. 5, nodes having the sme state number (I) have the same state of the shift register. As described previously, a convolutional code whose constraint length is K and its coding rate $r = \frac{1}{2}$ has $N_s$ kinds of states of the shift register. In view of this aspect, the tree structure of FIG. 5 can be rewritten with states of the shift register and paths as shown in FIG. 7. A figure such as FIG. 7 is generally called a trellis. Supposing now that the stack includes the nodes 21 and 29 shown in FIG. 5, the content of the shift register of each node corresponds to (01) of level 5. That is, the two nodes 21 and 29 corresponds to the same state of the same tree level. In other words, the path P1 directed to the node 21 and the path P2 to the node 29 of FIG. 7 merge at the state (01) at the fifth level. Thus, it is possible to select one of the two paths which has a larger path metrics and eliminate the other from the stack. Such a process is referred to as a state purging process.

The use of the numbering rule described previously will help the state purging process. That is, when each node is expressed by using the level number (L), the state block number (J) and the state number (I), the state purging process is carried out with regard to nodes stored in the stack each of which has the same value of L and the same value of I. In this case, there may plural such nodes. Therefore of the corresponding nodes, only one node having the largest path metric is selected as the most likely one and the rest are purged from the stack.

For instance, the nodes 21 and 29 are expressed by using L, J and I as (5, 2, 3) and (5, 4, 3), respectively. Since L=5 and I=3 in both the nodes, one node having a larger path metric, that is, the node 21 is restrained and the other node 29 is purged from the stack.

METRIC CALCULATION MANNER

As explained previously, according to the MLE method, the decoding operation proceeds up to $2^m$ destination nodes over m-levels at one time. In this case, the number of calculations of branch metrics per extension is equal to done $2^m$, while that of the Z-J algorithm is 2. As to the number of calculations per tree level, it is equal to 2 according to the Z-J algorithm, while it is equal to $$\left( \sum_{n=1}^{m} 2^n \right) / m$$

and thus increases with the value of (m). In order to avoid the increase in the number of calculations, it is considered to simplify the calculation process of branch metrics.

Figure 8:
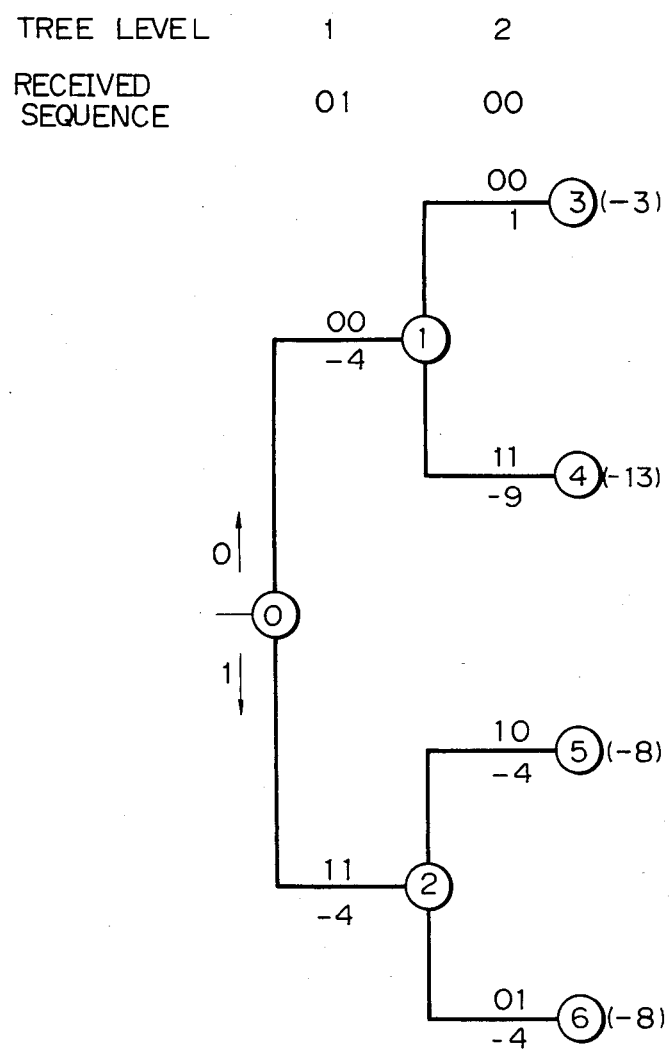

The structure of each branch of code-tree depends upon the characteristics of a code to be used. When a convolutional code whose constraint length K=3 and its coding rate $r = \frac{1}{2}$, the structure of each branch is determined as shown in FIG. 8. In this case, the Hamming distance between two branches leaving one node is always equl to 2, , when the coding rate $r = \frac{1}{2}$.

The present invention is also intended to simplify the calculation manner of branch metrics. It should be noted that according to the Z-J algorithm, it is necessary to calculate branch metrics by comparing the received sequence with all the branches extended. On the other hand, the branch metric manner according to the present invention is as follows:

Select any one of extended paths (a path of all 0-bit sequence, for example) as reference sequence and calculate the Hamming distance of the reference sequence against the received sequence.

Search a coinciding bit position indicating the digit position at which the binary digit in the selected path coincides with that in the received sequence. The path metric of the rest of the extended paths can easily be obtained by using the calculated Hamming distance and the position of the coinciding bit of the reference sequence.

By way of example, we consider the MLE method (m=2). Referring to FIG. 8 in which the received sequence is shown as (01,00), suppose that the path of the all 0-bit sequence connecting nodes 0, 1 and 3 in sequence is selected as the reference sequence. First of all, the Hamming distance between the received sequence (01) and the branch [0-1] at the level-1 (the branch [0-1] means a branch connecting nodes 0 and 1) is calculated. Then, the coincident bit position therebetween is searched. Secondly, the Hamming distance between the next received sequence (00) and the branch [1-3] at the level-2 is calculated. Then, the coinciding bit position therebetween is searched. In the case of FIG. 8, the Hamming distance of the branch [0-1] against the received sequence (01) is equal to 1. It follows that the Hamming distance of the other branch [0-2] leaving the node 0 is necessarily 1 because of the properties of the code. The Hamming distance of the branch [1-3] against the next received sequecence is equal to 0. Therefore, the Hamming distance against the received sequence (00) is necessarily equal to 2 with regard to the other branch [1-4]. Furthermore, the Hamming distance against the received sequence (00) is definitely equal to 1 to both of the branches [2-5] and [2-6] at the level-2 because of the properties of the code. Thus, if the values of the branch metrics are given 1, −4 and −9 corresponding to 0, 1 and 2 of the Hamming distances, respectively, the path metrics of the nodes 3, 4, 5 and 6 is equal to −3, −13, −8 and −8, respectively.

Figure 9:
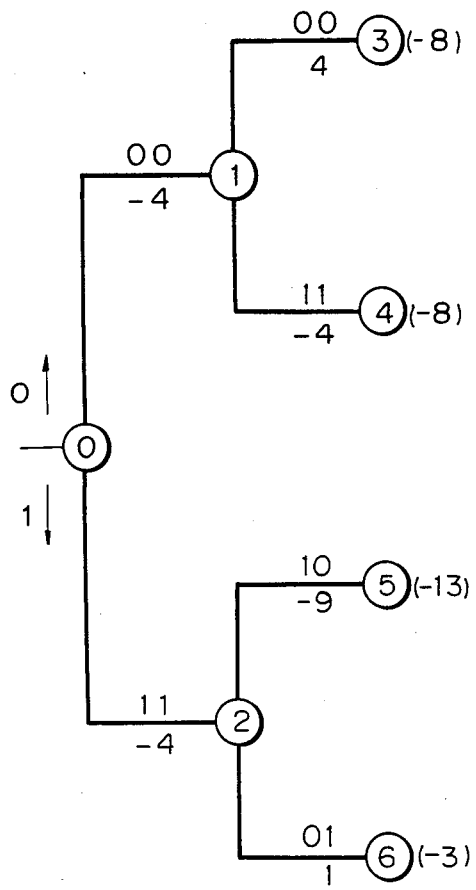

Moreover, we consider calculation of the path metrics in the case that the received sequence is (01,01) as illustrated in FIG. 9. In this case, when the Hamming distance against the received sequence (01) is equal to 1 with respect to the branch [1-3], the Hamming distance to the other branch [1-4] is also equal to 1. On the other hand, in order to get the path metrics containing the branches leaving the node 2, it is necessary to search whether a coinciding bit between the received sequence and the branch [1-3] is located at the first digit or the second digit thereof. In the above example, the first digit of the received sequence at the level-2 coincides with that of the branch [1-3]. The second digit of the received sequence does not coincide with that of the branch [1-3]. Therefore, the Hamming distance against the received sequence is necessarily equal to 2 with respect to the branch [2-5], and the Hamming distance is necessarily equal to 0 to the branch [2-6]. Consequently, the path metrics of the nodes 3, 4, 5 and 6 are determined as −8, −8, −13 and −3, respectively. If the received sequence at the level-2 is (10), the first bits of two sequences do not coincide with each other, while the second bit coincides with each other. Therefore, the Hamming distance against the received sequence is necessarily equal to 0 with respect to the branch [2-5] and the Hamming distance is necessarily equal to 2 to the branch [2-6]. As a result, the path metrics of the nodes 3, 4, 5 and 6 are determines as −8, −8, −3 and −13, respectively.

OMITTING OF EXTENSION

Figure 10:
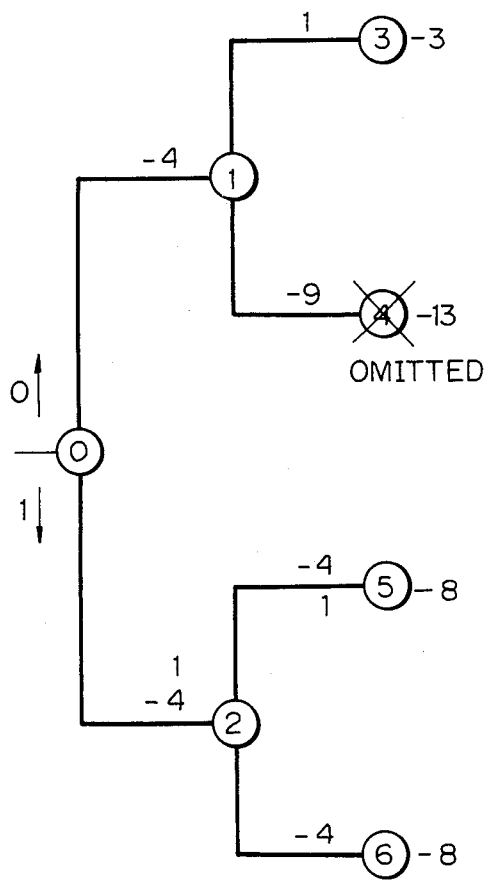
FIG. 10 is an explanation view of an omission process of extension according to the present invention.

As described previously, according to the present MLE method, decoding proceeds up to $2^m$ nodes at a time. For example, as shown in FIG. 10, which corresponds to FIG. 8, when the extension level m=2, four pats reaching the nodes 3, 4, 5 and 6 are configurated at a time. We consider the properties of the branch metrics of the paths reaching those nodes. In this example, the branch arriving at the node 4 has the smallest branch metric. It is inferred that the possibility that the node 4 at which the branch having the smallest branch metric arrives is placed at the top of the stack is very low, compared with the remaining nodes. Therefore, the present invention prevents the node 4 from being inserted into the stack: that is, extension of the branch to the node 4 is omitted. When the extension level (m) is over 2, two or more nodes may be omitted. Hereafter, the number of nodes to be omitted is indicated by character(p).

This omitting of extension permits the reduction of the number of nodes to be handled in one time of the extension process. This leads to the decrease in decoding time as compared with the Z-J algorithm.

Figure 11:
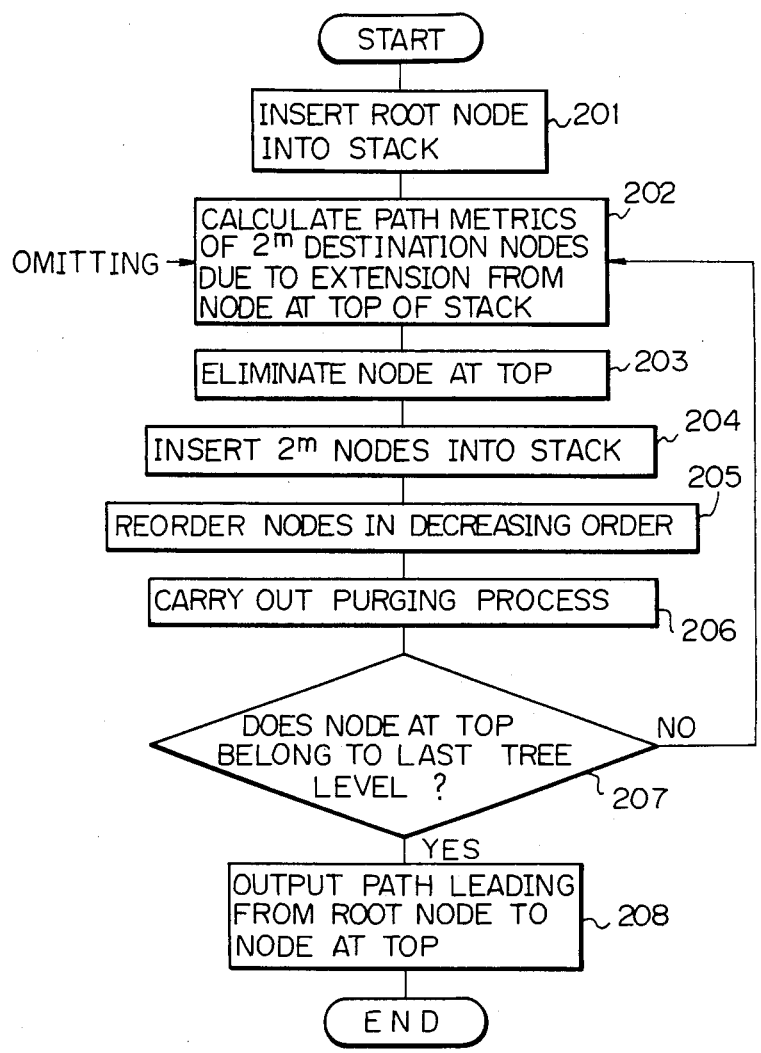
FIG. 11 is a flowchart of decoding according to the present invention.

FIG. 11 is a flowchart of the decoding process according to the present invention.

(1) Firstly, insert the root node into the stack and place it at the top (block 201).

(2) Calculate path metrics of $2^m$ destination nodes due to multi-level extension from the root node placed at the top of the stack (block 202). In this case, when omission of extension (p=1, for instance) is added to the MLE method, the path metrics of $(2^m-1)$ nodes are calculated.

(3) Eliminate the node placed at the top (block 203).

(4) Insert $2^m$ nodes into the stack (block 204). When omission of extension is used in block 202, the number of nodes to be entered is equal to $(2^m-1)$.

(5) Arrange nodes stored in the stack in decreasing order of the path metric (block 205).

(6) Carry out the purging process (block 206). In this case, the metric purging process is periodically carried out every 10-20 steps for example, while the state purging process is carried out each step.

(7) Repeat the sequence of block 202 to block 207. When a node belonging to the last tree level is placed at the top of the stack, decoding is terminated (block 207).

(8) Trace back nodes from the node at the top up to the root node and output one path leading therebetween as the decoded sequence (block 208).

Table-2 shows the content of the stack according to the MLE method where m=2, and Table 3 shows that when omission of extension (p=1) is added to the MLE method (m=2). It is assumed that in both the cases, the received sequence to be decoded is the same as that shown in FIG. 4.

TABLE 2

| Step | Node Number in the Stack (Path Metric) |
|---|---|
| 1 | 0(0) |
| 2 | 4(−3), 6(−8), 5(−8), 3(−13) |
| 3 | 21(−6), 6(−8), 5(−8), 20(−11), 19(−11) |

TABLE 2-continued

| Step | Node Number in the Stack (Path Metric) |
|---|---|
| | 3(−13), 22(−16) |
| | (Termination of Decoding) |

TABLE 3

| Step | Node Number in the Stack (Path Metric) |
|---|---|
| 1 | 0(0) |
| 2 | 4(−3), 6(−8), 5(−8) |
| 3 | 21(−6), 6(−8), 5(−8), 20(−11), 19(−11) |
| | (Termination of Decoding) |

It will be apparent from Tables-2 and -3 that according to the MLE method having the omitting process of extension, the node 3 at the step-2 in Table 2 has been omitted and the node 22 at the step-3 has also been omitted. Comparing Table-3 with Table-1, it will be appreciated that the number of nodes to be handled in accordance of the MLE method with omittig is smaller than that based on the conventional Z-J algorithm. This means that the MLE method using omitting of extension permits the reduction in the decoding time as well as the stack memory size.

Figure 12:
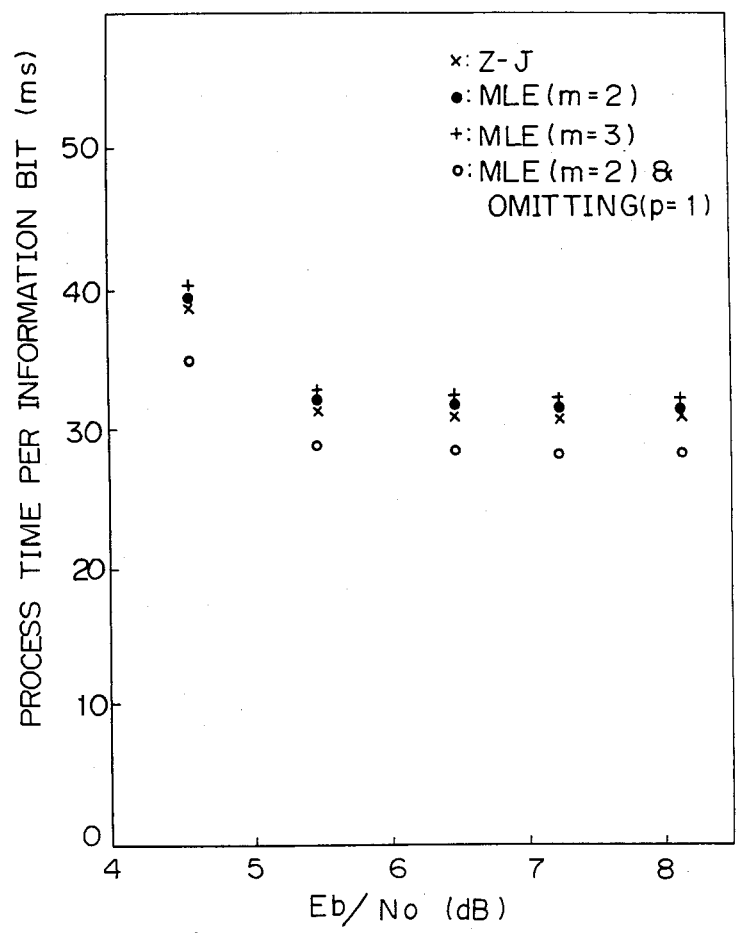
FIGS. 12 and 13 are explanation views of advantages of the present invention.

FIG. 12 is an explanation view for showing the difference in the decoding time based on each of the present invention and the conventional Z-J algorithm, in which the abscissa shows the Eb/No in dB and the ordinate shows the process time per information bit. It will be apparent from FIG. 12 that the process time based on the MLE method (m=2) using omission of extension (P=1) is improved over 10 o/o compared with the conventional Z-J algorithm.

Figure 13:
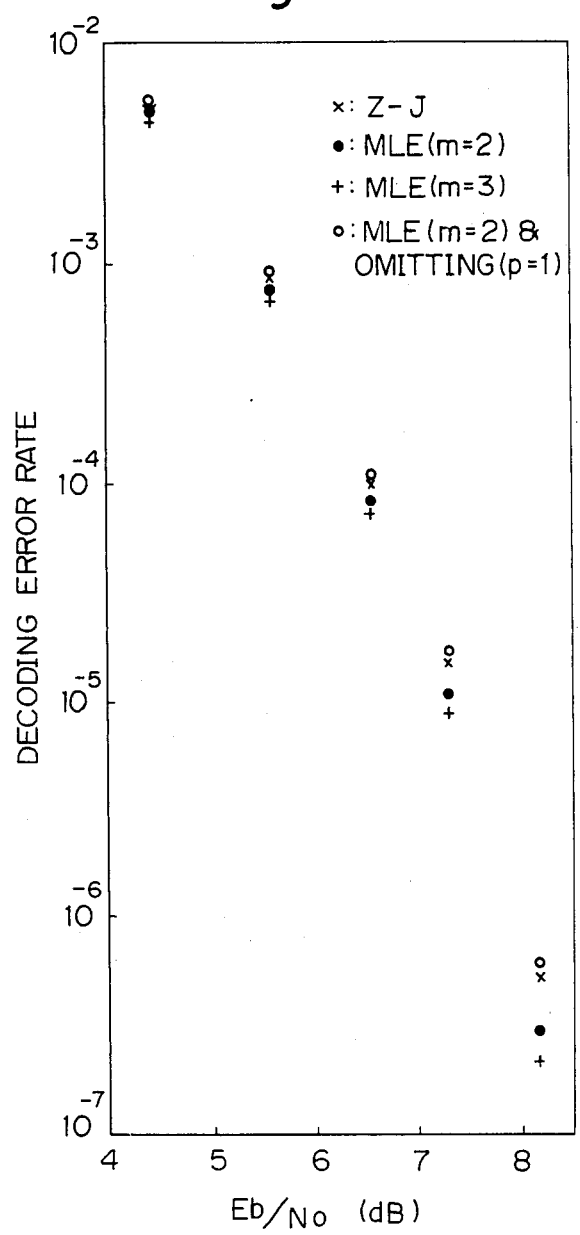

FIG. 13 is an explanation view for showing the decoding error rate based on each of the present invention and the Z-J algorithm, in which the abscissa shows the Eb/No in dB and the ordinate shows the decoding error rate. It will be understood that the decoding error rate is improved by means of the MLE method and decreases with the increase of the extension level (m). Moreover, it will be observed that the MLE method (m=2) using omission of extension (P=1) is a little inferior to the Z-J algorithm in view of the decoding error rate. However, the reduction in the process time will be well worth the a littel increase in the decoding error rate.

Figure 14:
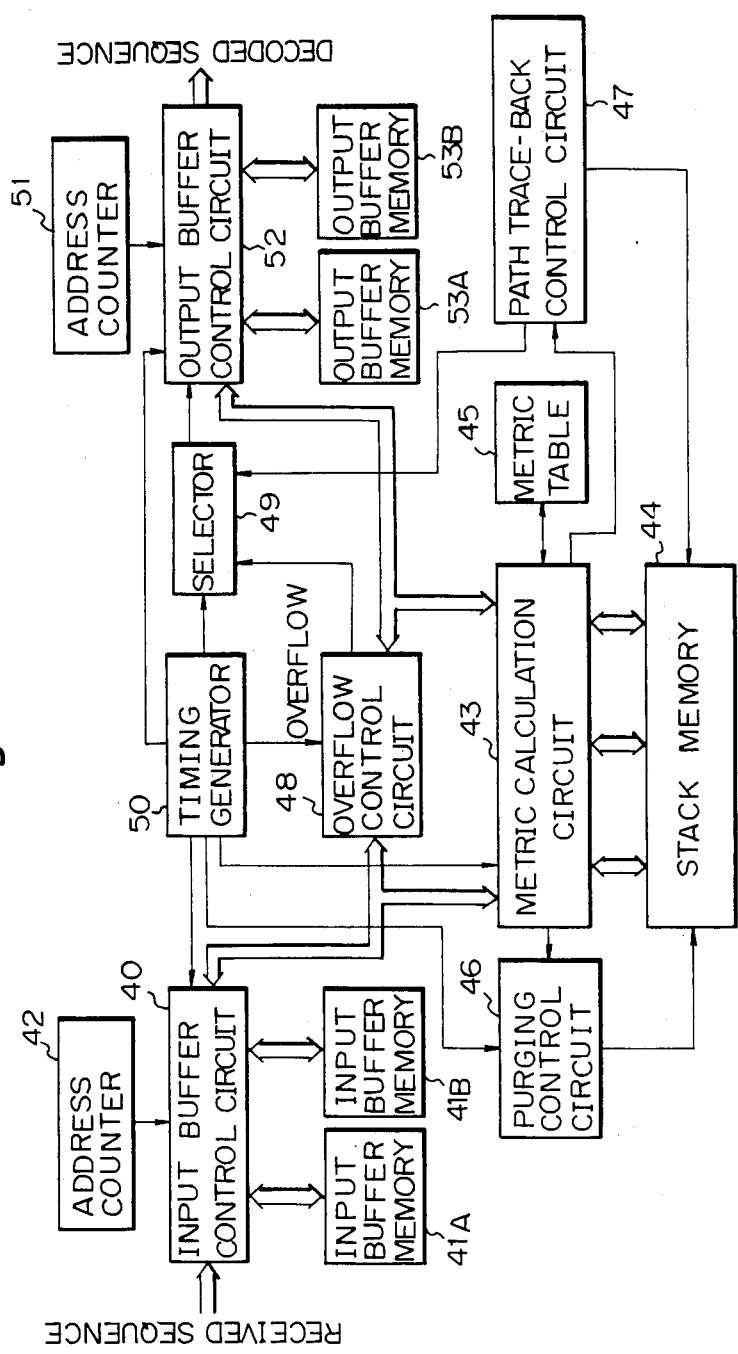
FIG. 14 is a block diagram of a sequential decoder according to the present invention.

The description will now be given of a sequential decoder according to the present invention, referring to FIG. 14.

A bit sequence received from a channel is fed to an input buffer control circuit 40, which controls input buffer memories 41A and 41B to alternately write the received sequence per block at the addresses designated by an address counter 42. Those two input buffer memories are intended to cope with the variation in the computational quantity for decoding due to the degree of noise on the channel. That is, the buffer memory act to absorb the variation in delay of the decoding time. It should be noted that if a single buffer memory is provided, decoding would not be terminated upon reception of the next block to be decoded. The received sequence read out from one of the buffer memories 41A and 41B is supplied via the control circuit 40 to a metric calculation circuit 43. This circuit 43 calculates branch metrics and path metrics and also control a stack memory 44. In other words, the metric caluculation circuit 43 performs the processes in the blocks 201-205 and 207 shown in FIG. 11. Especially, calculation of metrics is executed with reference to a metric table 45, which is composed of, for example, two branch metric talbles 45A and 45B, as shown in FIG. 15. The metric calculation circuit 43 provides the metric table 45 with the received sequence every four bits (which correspond to two code words). The first two digits are supplied to the branch metric table 45A and the following two digits to the table 45B. The branch metric table 45A generates the first branch metric and the second branch metric corresponding to the combination of the two digits supplied referring to data of state of the origin node, as shown in FIG. 15. In this case, the first and second branch metrics are associated with, for example, the branchs [0-1] and [0-2], respectively, in FIG. 8. The branch metric table 45B generates the third to sixth branch metrics, corresponding to the combination of the two bits supplied also referring to the origin state data, as shown in FIG. 15. The third to sixth branch metrics are relative to, for instance, the branches [1-3], [1-4], [2-5] and [2-6], respectively, in FIG. 8. Assuming that the same received sequence as that in FIG. 8 is received when the origin state is (00), the first two bits of the received sequence (01) is fed to the table 45A and the remaining two bits (00) to the table 45B. Then, the table 45A generates (−4, 31 4) as the first and second branch metrics, respectively. The table 45B generates (1, −9, −4, −4) as the third to sixth branch metrics, respectively. It should be noted that the use of the branch metrics is based on the properties of the code described previously.

The first branch metric is supplied to adders 60A and 60B, and the second branch metric to adders 60C and 60D. Those adders 60A to 60D are contained in the metric calculation circuit 43. The third to sixth branch metrics are supplied to the adders 60A to 60D, respectively. Furthermore, an origin path metric is fed from a stack memory 44 in FIG. 14 to each adder. The origin path metric is the path metric of the node placed at the top of the stack 44. The adders 60A to 60D output the first to fourth path metrics to the control circuit (which are associated with the paths [0-1-3], [0-1-4], [0-2-5] and [0-2-6], respectively in FIG. 8). Then, the metric calculation circuit 43 executes the processes in the blocks 203, 204 and 205 in FIG. 11.

The metric calculation circuit 43 also provides a purging control circuit 46 with an indication of start of the purging operation. The purging control circuit 46 then carries out the periodical metric pruging process and the state purging process explained previously.

A path trace-back control circuit 47 performs the process in the block 208 in FIG. 11. When the circuit 47 gets one path from the root node to the node at the top of the stack 44 at the final stage of decoding, that path is read out from the stack 44 and is then supplied via the metric calculation circuit 43 to an output buffer control circuit 52. Then, the control circuit 52 controls output buffer memories 53A and 53B to alternately write the decoded sequence per block therein in response to a sequence of addresses generated by an address counter 51. Then, the decoded sequence alternately read out from the memories 53A and 53B is output.

An overflow control circuit 48 is provided in order to cope with an overflow of the input buffer memories 41A and 41B. If the code is transmitted over an extremely noisy channel, the received sequence will contain many errors. In this case, it would be difficult to terminate decoding within a predetermined decoding time. In order to avoid such a problem, when the overflow control circuit 48 is acquainted with the occurence of the overflow by a timing generator 50 including a countor (not shown), it will generate the information sequence directly from the received sequence and provide the output buffer control circuit 52 with the generated information sequence. At this time, the overflow control circuit 48 acquaints the output buffer control circuit 52 through the selector 49 with occurrence of the overflow. In response to that indication, the generated information sequence is output through the output buffer control circuit 52. In order to effectively generate the information sequence directly from the received sequence, it is preferable to use such a convolutional code as a systematic code or quick look in code. Operation explained above is performed in synchronization with timing signals derived from the timing generator 50.

From the foregoing, it will now be apparent that a novel and improved sequential decoding method and an apparatus have been proposed. It should be understood of course that embodiments disclosed are merely illustrative and are not intend to limit the scope of the invention. Reference should be made to the appended claims, therefore, rather than the specification as indicating the scope of the invention.

What is claimed is:

1. A sequential decoding method for decoding a received code word sequence which is convolutionally encoded, by determining a most likely path on a code tree specified by a coder on a transmit side referring to the received sequence, comprising:
   a first step of inserting a root node of the tree into a top of a stack memory;
   a second step extending path to multiple nodes over a plurality of tree levels at a time along with the code tree, from one node placed at the top of the stack memory;
   a third step of calculating likelihoods of destination nodes at which the extension arrive referring to the received sequence;
   a fourth step of eliminating the node placed at the top from the stack and then storing the destination nodes instead;
   a fifth step of arranging all the nodes stored in the stack in decreasing order of the likelihood, so that one node with the largest likelihood is placed at the top instead of the eliminated node;
   a sixth step of repeating a set of steps from the second step to the fifth step until a node belonging to the last tree level of a data block is placed at the top; and
   a seventh step of outputting, as decoded sequence, a code word sequence associated with a path leading from the root node to the node of the last tree level.

2. A sequential decoding method according to claim 1, wherein before the destination nodes are stored in the stack at the fourth step, one or some of the destination nodes, which have some of the smallest likelihoods, is omitted after the third step.

3. A sequential decoding method according to claim 1, wherein the fifth step is followed by a step of purging, from the stack, nodes whose likelihoods are smaller than that of one node having the smallest likelihood of the destination nodes which have just be inserted into the stack by the fourth step.

4. A sequential decoding method according to claim 1, wherein when two or more extended paths merge, only one destination node, associated with the path which has the largest likelihood, is retained in the stack and the other nodes are purged from the stack.

5. A sequential decoding apparatus for decoding a received code word sequence which is convolutionally encoded, by determining a most likely path on a code tree referring to the received sequences, comprising:
   input memory means for storing the received sequence;
   stack memory means for storing nodes and their attributes which are provided by a calculation means;
   said calculation means for extending paths along the code tree from one node, located at the top of the stack memory means, over plural tree levels at a time, calculating likelihoods of destination nodes at which the extension arrive referring to the received sequence, eliminating the node placed at the top of the stack memory means and then storing and reordering the destination nodes so that one of the nodes which have the largest likelihood may be placed at the top instead; and
   tracking-back means for tracking-back from the node placed at the top of the stack at the final stage of decoding to a root node of the tree and then outputting one path leading therebetween as the decoded sequence.

6. A sequential decoding apparatus according to claim 5, wherein before the calculation means stores the destination nodes in the stack memory means, omitting one or some of the destination nodes which have some of the smallest likelihoods and does not store them therein.

7. A sequential decoding apparatus according to claim 5, wherein the apparatus further comprises purging means for purging, from the stack memory means, nodes whose respective likelihoods are smaller than that of one node having the smallest likelihood of the destination nodes which have just been inserted into the stack memory means.

8. A sequential decoding apparatus according to claim 7, wherein when two or more extended paths merge, the purging means further purges, from the stack memory means, all the destination nodes associated with the merged paths except one which has the largest likelihood.

* * * * *